(12) United States Patent
Lin et al.

(10) Patent No.: US 10,842,023 B2
(45) Date of Patent: *Nov. 17, 2020

(54) SUPPORT STRUCTURE FOR SUPPORTING FLEXIBLE DISPLAY SCREEN, AND FLEXIBLE DISPLAY SCREEN MODULE

(71) Applicant: GUANGDONG OPPO MOBILE TELECOMMUNICATIONS CORP., LTD., Dongguan, Guangdong (CN)

(72) Inventors: Yugui Lin, Guangdong (CN); Jiao Cheng, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/433,292

(22) Filed: Jun. 6, 2019

(65) Prior Publication Data

US 2019/0289721 A1    Sep. 19, 2019

Related U.S. Application Data

(63) Continuation of application No. 16/303,765, filed as application No. PCT/CN2017/091266 on Jun. 30, 2017.

(30) Foreign Application Priority Data

Jul. 8, 2016    (CN) .......................... 2016 1 0542572

(51) Int. Cl.
*H05K 1/00* (2006.01)
*H05K 1/18* (2006.01)
(Continued)

(52) U.S. Cl.
CPC ............... *H05K 1/189* (2013.01); *G06F 1/16* (2013.01); *G06F 1/1652* (2013.01); *G09F 9/301* (2013.01);
(Continued)

(58) Field of Classification Search
CPC ...................... G06F 1/16; G06F 1/1652; G06F 2203/04102; G09F 9/301; H04M 1/0268;
(Continued)

(56) References Cited

U.S. PATENT DOCUMENTS 6,434,237 B1 *   8/2002   Murray ............... H04M 1/6075
                                                                 379/446
7,403,628 B2    7/2008   Murray
(Continued)

FOREIGN PATENT DOCUMENTS

CN          101163163         4/2008
CN          104423433         3/2015
(Continued)

OTHER PUBLICATIONS

SIPO, First Office Action for CN Application No. 201610542572, dated Jul. 25, 2017.
(Continued)

*Primary Examiner* — Yuriy Semenenko
(74) *Attorney, Agent, or Firm* — Hodgson Russ LLP

(57) ABSTRACT

A flexible screen support structure includes a first flexible board, a second flexible board, a side board, and a number of electromagnets. The second flexible board is arranged opposite to the first flexible board and defines a gap together with the first flexible board. The gap is filled with an electro-rheological fluid. The side board encloses outer peripheral sides of the first and second flexible boards and seals the gap. The electromagnets are secured to the first flexible board and located in the gap, each electromagnet has
(Continued)

a support surface attached to the first flexible board and a side surface at an acute angle to the support surface, and the side surfaces of adjacent electromagnets are mutually attached by a magnetic force to cause the first flexible board to roll up. A flexible display screen module is also provided.

15 Claims, 9 Drawing Sheets

(51) Int. Cl.
G06F 1/16 (2006.01)
H04M 1/02 (2006.01)
G09F 9/30 (2006.01)
H05K 1/03 (2006.01)
H05K 1/02 (2006.01)

(52) U.S. Cl.
CPC ........ *H04M 1/0268* (2013.01); *H05K 1/0393* (2013.01); *G06F 2203/04102* (2013.01); *H05K 1/0277* (2013.01); *H05K 2201/083* (2013.01); *H05K 2201/10128* (2013.01)

(58) Field of Classification Search
CPC .... H05K 1/0277; H05K 1/0393; H05K 1/189; H05K 2201/083; H05K 2201/10128
See application file for complete search history.

(56) References Cited

U.S. PATENT DOCUMENTS

| | | | |
|---|---|---|---|
| 2011/0181530 A1* | 7/2011 | Park | ................ G06F 3/016 345/173 |
| 2012/0038563 A1 | 2/2012 | Park et al. | |
| 2015/0055308 A1* | 2/2015 | Lim | ................ G04G 21/08 361/749 |
| 2015/0220117 A1* | 8/2015 | Lee | ................ G06F 1/1641 361/749 |
| 2017/0228022 A1 | 8/2017 | Shimanouchi | |
| 2018/0039302 A1* | 2/2018 | Levesque | ............ H04B 1/3833 |
| 2018/0348025 A1 | 12/2018 | Jahromi et al. | |
| 2019/0039796 A1* | 2/2019 | Farnham | ................ B32B 7/12 |
| 2019/0166696 A1* | 5/2019 | Lin | ................ G09F 9/301 |

FOREIGN PATENT DOCUMENTS

| | | |
|---|---|---|
| CN | 104536608 | 4/2015 |
| CN | 104751739 | 7/2015 |
| CN | 105449124 | 3/2016 |
| CN | 105518768 | 4/2016 |
| CN | 106125846 | 11/2016 |
| EP | 2912650 | 9/2015 |
| KR | 20080093816 | 10/2008 |

OTHER PUBLICATIONS

WIPO, ISR for CN Application No. PCT/CN2017/091266, Aug. 30, 2017.
EPO, Office Action for EP Application No. 17823572, dated Apr. 29, 2019.
SIPO, Second Office Action for CN Application No. 201610542572, dated Nov. 7, 2017.
SIPO, Notification to Grant Patent Right for Invention for CN Application No. 201610542572, dated Feb. 1, 2018.
USPTO, Office Action for U.S. Appl. No. 16/303,765, dated Jan. 16, 2020.

* cited by examiner

SUPPORT STRUCTURE FOR SUPPORTING FLEXIBLE DISPLAY SCREEN, AND FLEXIBLE DISPLAY SCREEN MODULE

CROSS-REFERENCE TO RELATED APPLICATION

The present application is a continuation application of U.S. application Ser. No. 16/303,765, filed Nov. 21, 2018, which is a national phase of International Application No. PCT/CN2017/091266, filed Jun. 30, 2017, which is based on and claims a priority to Chinese Patent Application No. 201610542572.1, filed Jul. 8, 2016. The entire disclosures of the aforementioned applications are incorporated herein by reference.

FIELD

The present disclosure relates to a technical field of electronic devices, and more particularly, to a support structure for supporting a flexible display screen, and a flexible display screen module.

BACKGROUND

With the development of flexible display technology, the flexible display screen is increasingly used in mobile terminals, and a support structure is used to realize collapse or expansion of the flexible display screen. At present, most mobile terminals have two kinds of support structures, namely a support structure of a folding mode, and a support structure of a rolling mode. When the mobile terminal adopts the support structure of the folding mode, the flexible display screen is conveniently supported by a board after being expanded, but it is not easy to reduce the volume after the flexible display screen is folded. When the mobile terminal adopts the support structure of the rolling mode, the flexible display screen can be rolled up with volume shrinkage, but there is no support structure, which is not conducive to supporting the flexible display screen after being expanded. Therefore, there is currently no support structure that can facilitate the volume shrinkage of the flexible display screen and also facilitate the support of the flexible display screen after being expanded.

SUMMARY

Embodiments of the present disclosure provide a flexible screen support structure. The flexible screen support structure includes: a first flexible board, a second flexible board, a side board and a plurality of electromagnets. The first flexible board is configured to be attached to a flexible display screen. The second flexible board is arranged opposite to the first flexible board. The second flexible board and the first flexible board define a gap therebetween, and the gap is filled with an electro-rheological fluid. The side board encloses outer peripheral sides of the first flexible board and the second flexible board and seals the gap. The plurality of electromagnets are secured to the first flexible board and located in the gap, each electromagnet has a support surface attached to the first flexible board and a side surface at an acute angle to the support surface, and side surfaces of adjacent electromagnets are able to be attached to each other by a magnetic force to cause the first flexible board to roll up.

Embodiments of the present disclosure further provide a flexible display screen module. The flexible display screen module includes a flexible screen support structure and a flexible display screen. The flexible display screen includes a first flexible board, a second flexible board, a side board and a plurality of electromagnets. The first flexible board is configured to be attached to a flexible display screen. The second flexible board is arranged opposite to the first flexible board. The second flexible board and the first flexible board define a gap therebetween, and the gap is filled with an electro-rheological fluid. The side board encloses outer peripheral sides of the first flexible board and the second flexible board and seals the gap. The plurality of electromagnets are secured to the first flexible board and located in the gap, each electromagnet has a support surface attached to the first flexible board and a side surface at an acute angle to the support surface, and side surfaces of adjacent electromagnets are able to be attached to each other by a magnetic force to cause the first flexible board to roll up.

Embodiments of the present disclosure further provide a flexible display screen module. The flexible display screen module includes a flexible display screen; a flexible board, a side board and a plurality of electromagnets. The flexible board is arranged opposite to the flexible display screen. The flexible board and the flexible display screen define a gap therebetween, and the gap is filled with an electro-rheological fluid. The side board encloses outer peripheral sides of the flexible display screen and the flexible board and seals the gap. The plurality of electromagnets are secured to the flexible display screen and located in the gap. Each electromagnet has a support surface attached to the flexible board and a side surface at an acute angle to the support surface, and side surfaces of adjacent electromagnets are able to be attached to each other by a magnetic force to cause the flexible board to roll up.

BRIEF DESCRIPTION OF THE DRAWINGS

In order to illustrate technical solutions of the present disclosure more clearly, drawings required in embodiments will be briefly described below. Obviously, the drawings described below only show a part of embodiments of the present disclosure, and based on these drawings, other drawings can be obtained by those of ordinary skill in the art without creative efforts.

DETAILED DESCRIPTION

Figure 1:
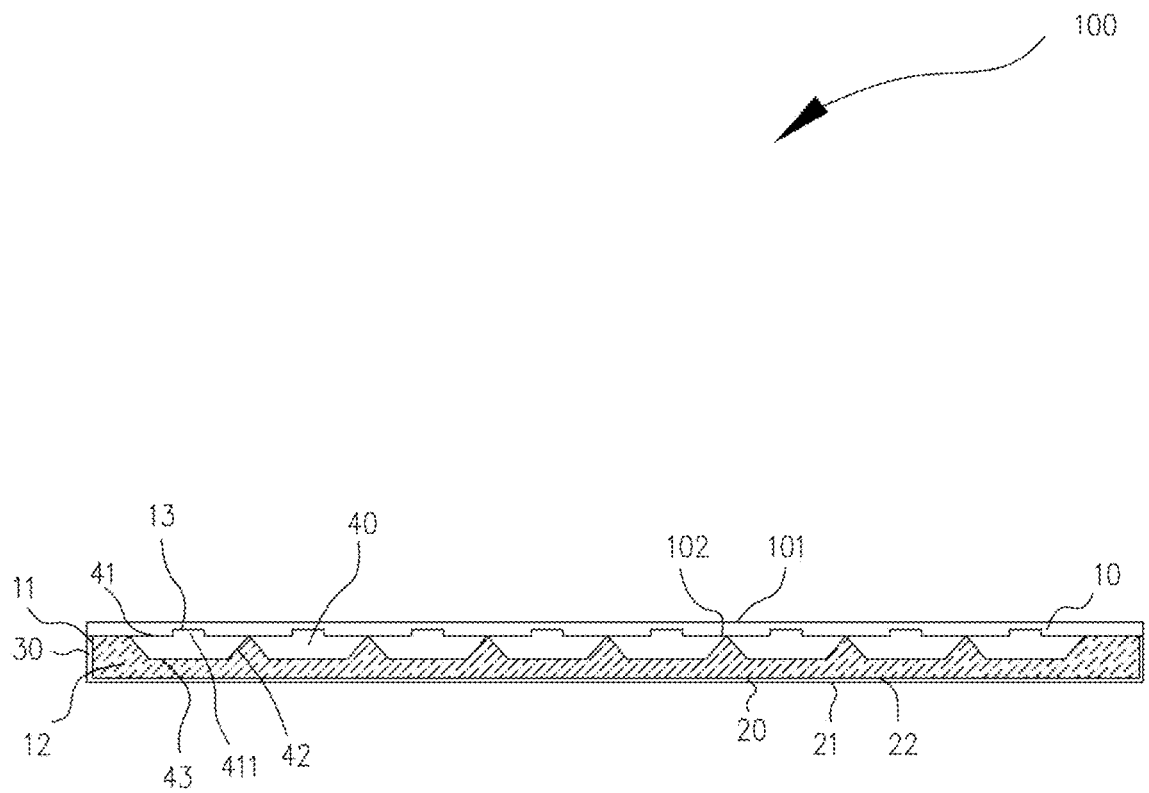
FIG. 1 illustrates a schematic view of a support structure for supporting a flexible display screen according to an embodiment of the present disclosure.

Technical solutions in embodiments of the present disclosure will be described clearly and completely with reference to the drawings.

The present disclosure relates a support structure for supporting a flexible display screen. The support structure includes: a first flexible board, a second flexible board, a side board and a plurality of electromagnets. The first flexible board is configured to be attached to the flexible display screen. The second flexible board is arranged opposite to the first flexible board. The second flexible board and the first flexible board defines a gap therebetween, and the gap is filled with an electro-rheological fluid. The side board encloses outer peripheral sides of the first flexible board and the second flexible board and seals the gap. The plurality of electromagnets are secured to the first flexible board and located in the gap, each electromagnet has a support surface attached to the first flexible board and a side surface at an acute angle to the support surface, and side surfaces of adjacent electromagnets are able to be attached to each other by a magnetic force to cause the first flexible board to roll up.

The present disclosure relates a flexible display screen module. The flexible display screen module includes a flexible display screen, a first flexible board, a second flexible board, a side board and a plurality of electromagnets. The first flexible board has a first outer surface and a first inner surface arranged oppositely, and the flexible display screen is attached to the first outer surface. The second flexible board is arranged opposite to the first flexible board and spaced apart from the first flexible board, and the first inner surface is oriented towards the second flexible board. The side board encloses outer peripheral sides of the first flexible board and the second flexible board to cooperatively define a cavity with the first flexible board and the second flexible board, and the cavity is filled with an electro-rheological fluid. The plurality of electromagnets are secured to the first inner surface and located in the cavity. Each electromagnet has a side surface, side surfaces of two adjacent electromagnets defines a clearance therebetween, and the side surfaces of two adjacent electromagnets being able to be attached to each other by a magnetic force to cause the first flexible board to roll up.

The present disclosure relates another flexible display screen module. The flexible display screen module includes a flexible display screen; a flexible board, a side board and a plurality of electromagnets. The flexible board is arranged opposite to the flexible display screen. The flexible board and the flexible display screen defines a gap therebetween, and the gap is filled with an electro-rheological fluid. The side board encloses outer peripheral sides of the flexible display screen and the flexible board and seals the gap. The plurality of electromagnets are secured to the flexible display screen and located in the gap. Each electromagnet has a support surface attached to the flexible board and a side surface at an acute angle to the support surface, and side surfaces of adjacent electromagnets are able to be attached to each other by a magnetic force to cause the flexible board to roll up.

Figure 2:
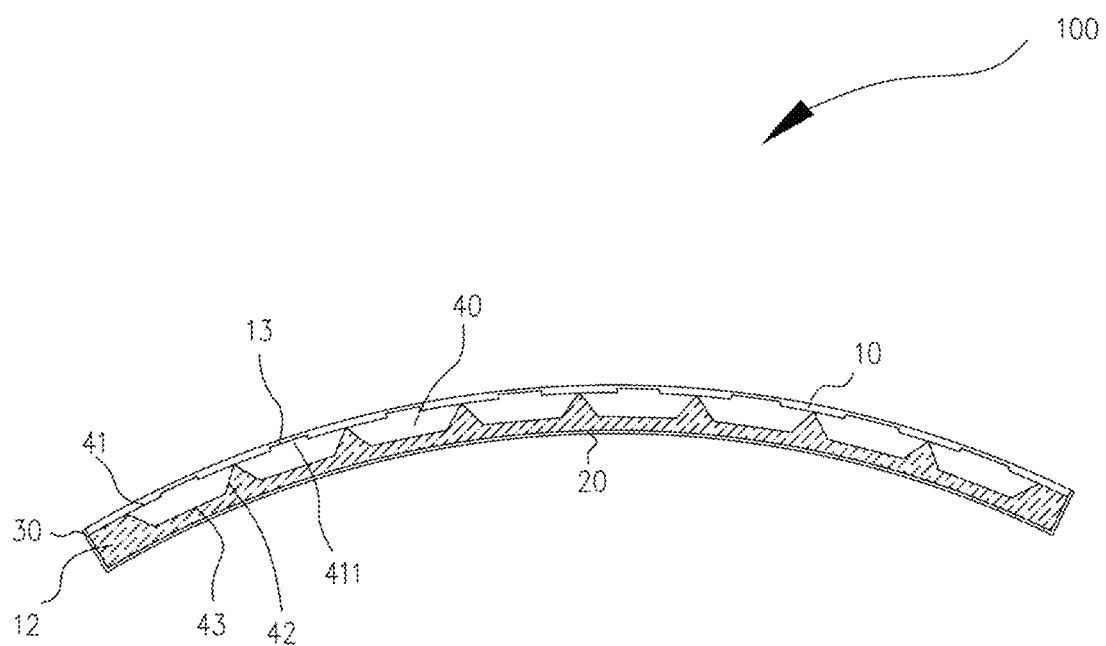
FIG. 2 illustrates a bent state of the support structure of FIG. 1.

As illustrated in FIGS. 1 and 2, a support structure 100 for supporting a flexible display screen 1 provided by the present disclosure includes a first flexible board 10 configured to be attached to the flexible display screen 1; a second flexible board 20 arranged opposite to the first flexible board 10, in which a gap 11 is defined between the second flexible board 20 and the first flexible board 10 and filled with an electro-rheological fluid 12; a side board 30 coupling outer peripheries of the first flexible board 10 and the second flexible board 20 and sealing the gap 11; a plurality of electromagnets 40 secured to the first flexible board 10 and located in the gap 11, in which each electromagnet 40 has a support surface 41 attached to the first flexible board 10 and a side surface 42 at an acute angle to the support surface 41, and side surfaces 42 of adjacent electromagnets 40 are attached to each other by a magnetic force to cause the first flexible board 10 to roll up.

It could be understood that the support structure 100 is applied to a mobile terminal, and a side of the first flexible board 10 facing away from the second flexible board 20 is attached to the flexible display screen 1, such that the flexible display screen 1 can be rolled up or expanded. The mobile terminal can be a mobile phone, a tablet computer, a notebook computer or the like.

By providing the electro-rheological fluid 12 between the first flexible board 10 and the second flexible board 20, and securing the plurality of electromagnets 40 to the first flexible board 10, when the first flexible board 10 and the second flexible board 20 are expanded, a voltage is applied to the electro-rheological fluid 12 to make the electro-rheological fluid 12 become solid, such that the electro-rheological fluid 12 and the electromagnets 40 together support the first flexible board 10, and hence the first flexible board 10 exhibits a characteristic of a hard board, so as to support the flexible display screen 1. When the first flexible board 10 and the second flexible board 20 are rolled up, the voltage is revoked from the electro-rheological fluid 12 and the plurality of electromagnets 40 are energized to make the electro-rheological fluid 12 become liquid and make the electromagnets 40 magnetic, such that the side surfaces 42 of the two adjacent electromagnets 40 are attached to each other under magnetic attraction, and hence the first flexible board 10 and the second flexible board 20 are tightly rolled up together, thereby facilitating the rolling of the flexible display screen 1. The support structure 100 can support the flexible display screen 1 when the flexible display screen 1 is expanded, and facilitate tight rolling and collapse of the flexible display screen 1 when the flexible display screen 1 is rolled up, thereby improving user experience.

In this embodiment, the first flexible board 10 is a rectangular board. The first flexible board 10 exhibits flexibility, and can be bent freely under an external force. The first flexible board 10 includes a first outer surface 101 and a first inner surface 102 arranged oppositely, and the first inner surface 102 is oriented towards the second flexible board 20. When the support structure 100 is applied to the mobile terminal, the first outer surface 101 is attached to the flexible display screen 1. The first inner surface 102 is densely provided with the plurality of electromagnets 40. The plurality of electromagnets 40 can be bonded to, snapped with, embedded in, or integrally provided to the first inner surface 102. Certainly, in other embodiments, the first flexible board 10 may be circular or in other polygonal shapes.

In this embodiment, the second flexible board 20 is a rectangular board. The second flexible board 20 has the same size as the first flexible board 10. The second flexible board 20 has a second outer surface 21 and a second inner surface 22 arranged oppositely. The second inner surface 22 is oriented towards the first flexible board 10. There is a clearance between the second inner surface 22 and the electromagnets 40, so that a flow channel of the electro-rheological fluid 12 is defined between the second inner surface 22 and the electromagnets 40, and hence it is convenient for the electro-rheological fluid 12 to flow in the flow channel when the support structure 100 is bent. The second flexible board 20 and the first flexible board 10 are bent together to facilitate protection of the electromagnets 40 while preventing leakage of the electro-rheological fluid 12. The second flexible board 20 and the first flexible board 10 can be made of the same material.

In this embodiment, the side board 30 is bonded to peripheral sides of the first flexible board 10 and the second flexible board 20. The side board 30 may be a flexible film, and the side board 30 has relatively good ductility. When the flexible display screen 1 needs to be rolled up, the first flexible board 10 and the second flexible board 20 are bent, and hence the first flexible board 10 and the second flexible board 20 are displaced, resulting in deformation of the side board 30, such that the side board 30 enhances the deformation performance of the support structure 100. In addition, side surfaces 42 of the plurality of electromagnets 40 approach to each other, so that the electro-rheological fluid 12 between the two adjacent electromagnets 40 is squeezed, and with relatively good deformation performance of the side board 30, the squeezed electro-rheological fluid 12 can flow to the side board 30 to cause the side board 30 to bulge. In other embodiments, the side board is made of high elastic rubber or a high elastic carbon fiber material.

In this embodiment, the first flexible board 10, the second flexible board 20, and the side board 30 together form an accommodating body, and the gap 11 forms an inner cavity of the accommodating body, such that the electro-rheological fluid 12 is accommodated in the accommodating body and thus are sealed. The electro-rheological fluid 12 can be crystallized under an energized condition, hence can be converted from a liquid state to a solid state, and finally can exhibit solid properties, such that the first flexible board 10 and the second flexible board 20 are stress-supported and cannot be deformed, thereby facilitating the support of the flexible display screen 1. Likewise, the electro-rheological fluid 12 can be converted from the solid state to the liquid state under a de-energized condition, and finally exhibit liquid properties, such that the first flexible board 10 and the second flexible board 20 are easily deformed, thereby facilitating the rolling of the flexible display screen 1.

In this embodiment, the electromagnet 40 is tapered. As an implementation, the electromagnet 40 is a frustum of square pyramid, and the electromagnet 40 has a square cross section perpendicular to a height direction. It should be noted that, the height direction of each electromagnet 40 refers to a direction perpendicular to the respective support surface 41 of the electromagnet 40. The plurality of electromagnets 40 can be closely arranged to the first flexible board 10. Specifically, since the support surfaces 41 of the two adjacent electromagnets 40 are closely coupled, when the flexible display screen 1 and the first flexible board 10 are in an expanded state, height directions of the two adjacent electromagnets 40 are parallel to each other, and thus there is a clearance between the side surfaces 42 of the two adjacent electromagnets 40. The electro-rheological fluid 12 is present in that clearance, and in such a case, the electro-rheological fluid 12 is energized and hence exhibits solid properties, so that the side surfaces 42 of the two adjacent electromagnets 40 cannot approach to each other. In such a way, the support surfaces 41 of the plurality of electromagnets 40 collectively support the first flexible board 10, and the first flexible board 10 can support the flexible display screen 1, thereby facilitating operations on the flexible display screen 1 after being expanded. Likewise, after the electro-rheological fluid 12 is de-energized, the electro-rheological fluid 12 exhibits the liquid state, such that the first flexible board 10 and the second flexible board 20 are rolled up under an external force, to cause the flexible display screen 1 to roll up. At this time, the electro-rheological fluid 12 between the two adjacent electromagnets 40 can flow, the side surfaces 42 of the two adjacent electromagnets 40 will approach to each other as the first flexible board 10 is deformed, and hence the electro-rheological fluid 12 capable of flowing is squeezed, such that the side surfaces 42 of the two adjacent electromagnets 40 are finally attached together. In such a case, the two adjacent electromagnets 40 are energized and hence magnetized, and the two adjacent electromagnets 40 are secured together under mutual magnetic attraction. Further, the external force is revoked from the first flexible board 10 and the second flexible board 20, and the first flexible board 10 and the second flexible board 20 can still be in a rolled-up state, so that the support structure 100 can keep the flexible display screen 1 in a rolled-up state, thereby effectively reducing the space occupied by the flexible display screen 1. In other embodiments, the electromagnet 40 may also be a frustum of hexagonal pyramid or a conical frustum or the like. Certainly, in other embodiments, the electromagnet 40 may also be a combination of a rectangular block and a tapered block, the support surface 41 of the electromagnet 40 is provided to the rectangular block, while the side surface 42 is provided to the tapered block, and there may also be a clearance between the support surfaces 41 of the two adjacent electromagnets 40.

Figure 3:
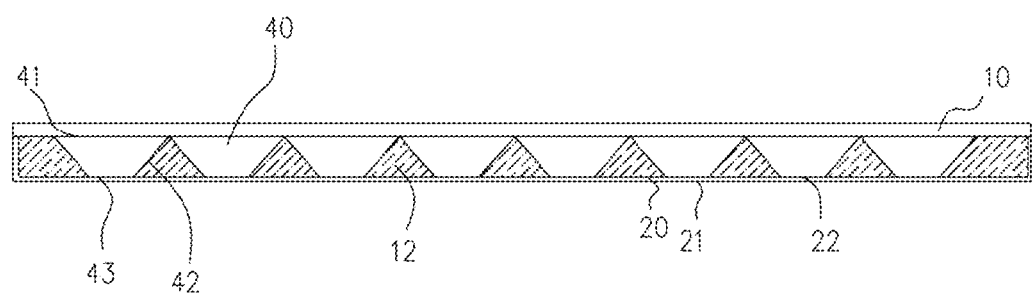
FIG. 3 illustrates a schematic view of a support structure for supporting a flexible display screen according to another embodiment of the present disclosure.
Figure 4:
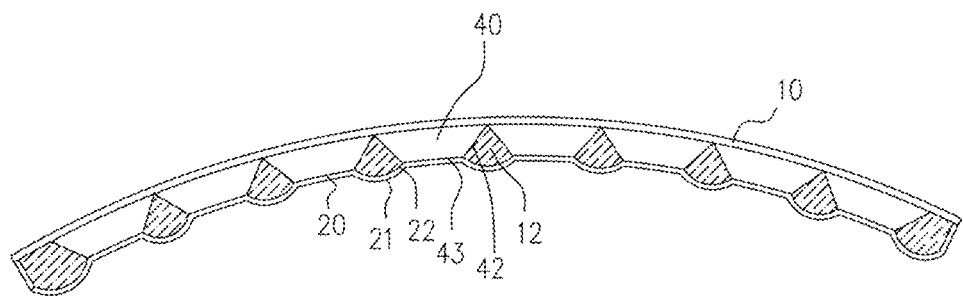
FIG. 4 illustrates a bent state of the support structure of FIG. 3.

Further, as illustrated in FIGS. 3 and 4, another embodiment is provided. Different from the above embodiment, each electromagnet 40 has a bottom surface 43 parallel to the support surface 41, and the bottom surface 43 is at an obtuse angle to the side surface 42. The bottom surface 43 of each electromagnet 40 is attached to the second flexible board 20. Specifically, in order to make the support structure 100 more stable, the bottom surface 43 of the electromagnet 40 is attached to the second flexible board 20, and the bottom surface 43 and the second flexible board 20 are secured together to avoid separation of the second flexible board 20 from the electromagnet 40, so as to prevent leakage of the electro-rheological fluid 12. Moreover, by attaching the bottom surface 43 of the electromagnet 40 to the second flexible board 20, an area of the second flexible board 20 between two adjacent electromagnets 40 forms a deformable channel. When the first flexible board 10 and the second flexible board 20 are rolled up together, the electro-rheological fluid 12 between the two adjacent electromagnets 40 may be squeezed to the deformable channel of the second flexible board 20 between the two adjacent electromagnets 40, thereby causing the area to bulge. In such a way, the squeezed electro-rheological fluid can be accommodated, to prevent the electro-rheological fluid 12 from being squeezed to the outside of the first flexible board 10 and the second flexible board 20, i.e. to prevent the leakage.

Further, as illustrated in FIGS. 1 and 2, in an embodiment, the plurality of electromagnets 40 are coupled via a conductive cable. In the present embodiment, in order to energize the plurality of electromagnets 40 conveniently at the same time, the plurality of electromagnets 40 are coupled in series by using the conductive cable. Specifically, the conductive cable can include a plurality of transverse wires and a plurality of longitudinal wires, each of the transverse wires is provided with a positive node while each of the longitudinal wires is provided with a negative node, and each positive node and each negative node are correspondingly coupled to the electromagnet 40. Each of the transverse wires is serially coupled to the plurality of electromagnets 40 arranged transversely, and each of the longitudinal wires is serially coupled to the plurality of electromagnets 40 arranged longitudinally. Thus, when the transverse wires and the longitudinal wires are energized, each electromagnet 40 receives a voltage and hence exhibits magnetic properties.

Further, the plurality of electromagnets 40 are arranged in an array on the first flexible board 10. In the present embodiment, the plurality of electromagnets 40 are arranged in a rectangular array on the first flexible board 10. Specifically, the plurality of electromagnets 40 are longitudinally arranged along a length direction of the first flexible board 10, and are arranged transversely along a width direction of the first flexible board 10. The first flexible board 10 can be rolled up in the width direction such that the side surfaces 42 of the plurality of electromagnets 40 arranged longitudinally approach to each other, or the first flexible board 10 is rolled up in the length direction so that the side surfaces 42 of the plurality of electromagnets 40 arranged transversely approach to each other.

Further, the first flexible board 10 is an elastic memory board. It can be understood that the first flexible board 10 is in a bent state under the action of an external force; after the external force is removed, the first flexible board 10 changes its own molecular chain from a bent state to a stretched state by self-intermolecular stress, such that the first flexible board 10 is allowed to return to the expanded state, and can drive the flexible display screen 1 to be restored to the expanded state automatically. In other embodiments, the first flexible board may also be made of an elastic material such as high elastic rubber or high elastic carbon fiber.

Further, the support surface 41 of the electromagnet 40 is provided with a protrusion 411, and the first flexible board 10 is provided with a groove 13 corresponding to and fitted with the protrusion 411. In this embodiment, the first inner surface 102 of the first flexible board 10 is provided with a plurality of grooves 13 corresponding to the protrusions 411 of the plurality of electromagnets 40. Since the protrusion 411 is fitted in the groove 13, and the support surface 41 is attached to the first inner surface 102, the plurality of electromagnets 40 and the first flexible board 10 are more stable in structure, and the plurality of electromagnets 40 can conveniently support the first flexible board 10.

Figure 5:
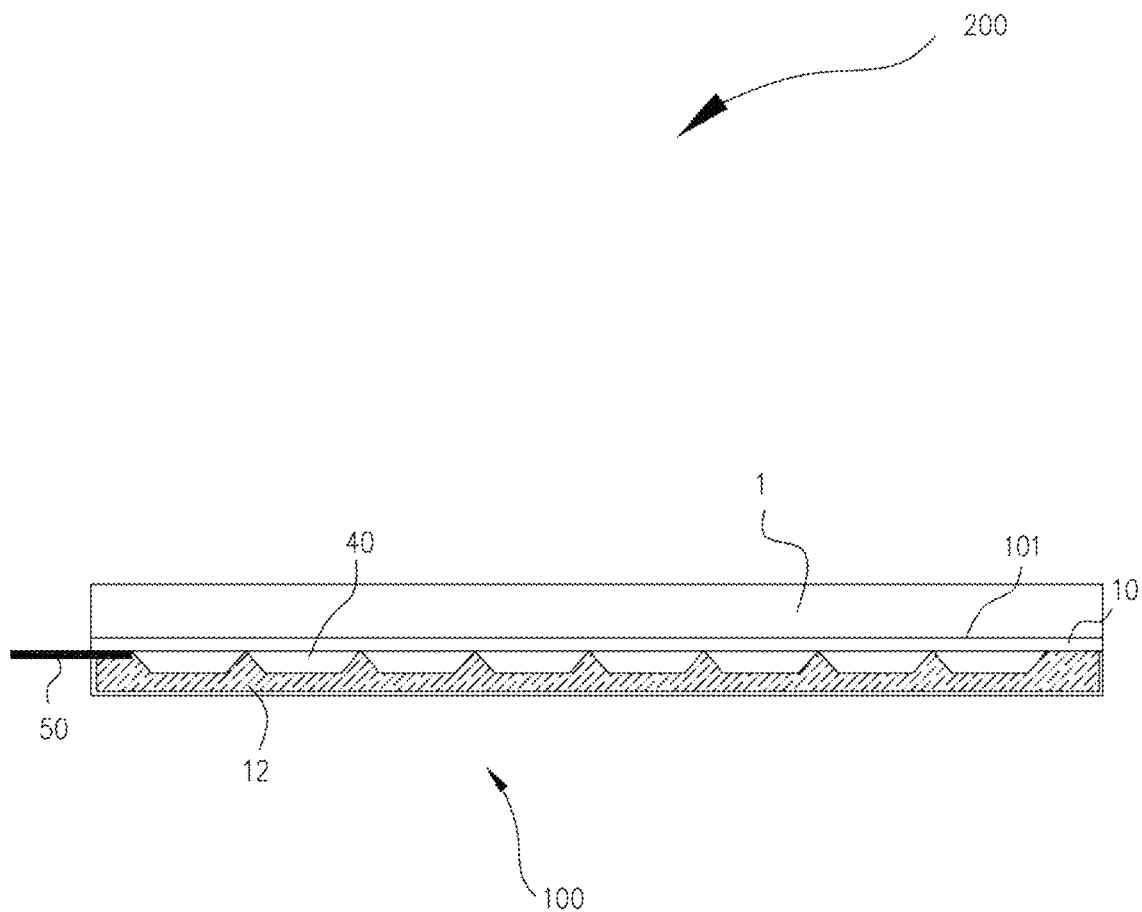
FIG. 5 illustrates a schematic view of a flexible display screen module according to the present disclosure.
Figure 6:
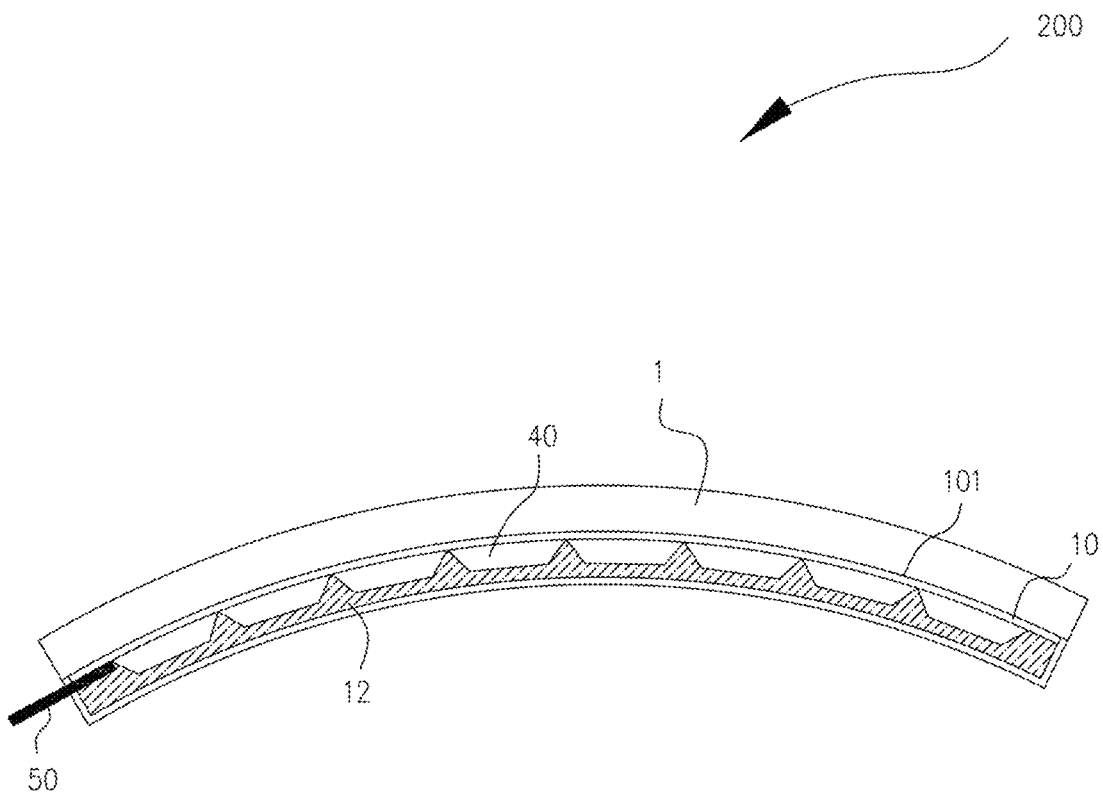
FIG. 6 illustrates a bent state of the flexible display screen module of FIG. 5.

As illustrated in FIGS. 5 and 6, the present disclosure further provides a flexible display screen module 200. The flexible display screen module 200 includes the support structure 100, and the flexible display screen module 200 also includes the flexible display screen 1. The flexible display screen 1 is attached to a side of the first flexible board 10 facing away from the second flexible board 20. In this embodiment, the flexible display screen 1 is an organic electroluminescent display layer, and the flexible display screen 1 is stacked on the support structure 100. Specifically, the flexible display screen 1 can be stacked on the first outer surface 101 of the first flexible board 10, and be bonded to the first outer surface 101 by glue.

Further, the flexible display screen module 200 further includes a flexible circuit board 50 which electrically couples the electro-rheological fluid 12 and the electromagnets 40, to provide an electrical signal to the electro-rheological fluid 12 and the electromagnets 40. The electro-rheological fluid 12 and the electromagnet 40 are electrically coupled by the flexible circuit board 50, thereby allowing the flexible display screen module 200 to adapt to various mobile terminals conveniently.

Figure 7:
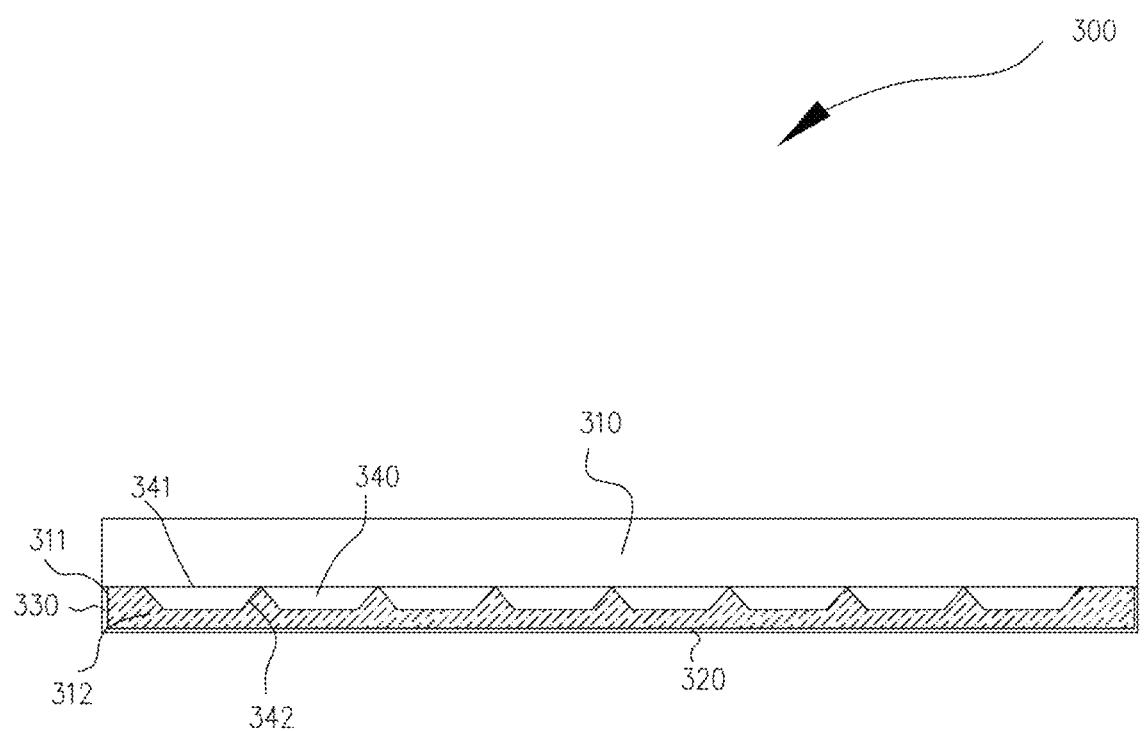
FIG. 7 illustrates a schematic view of another flexible display screen module according to the present disclosure.
Figure 8:
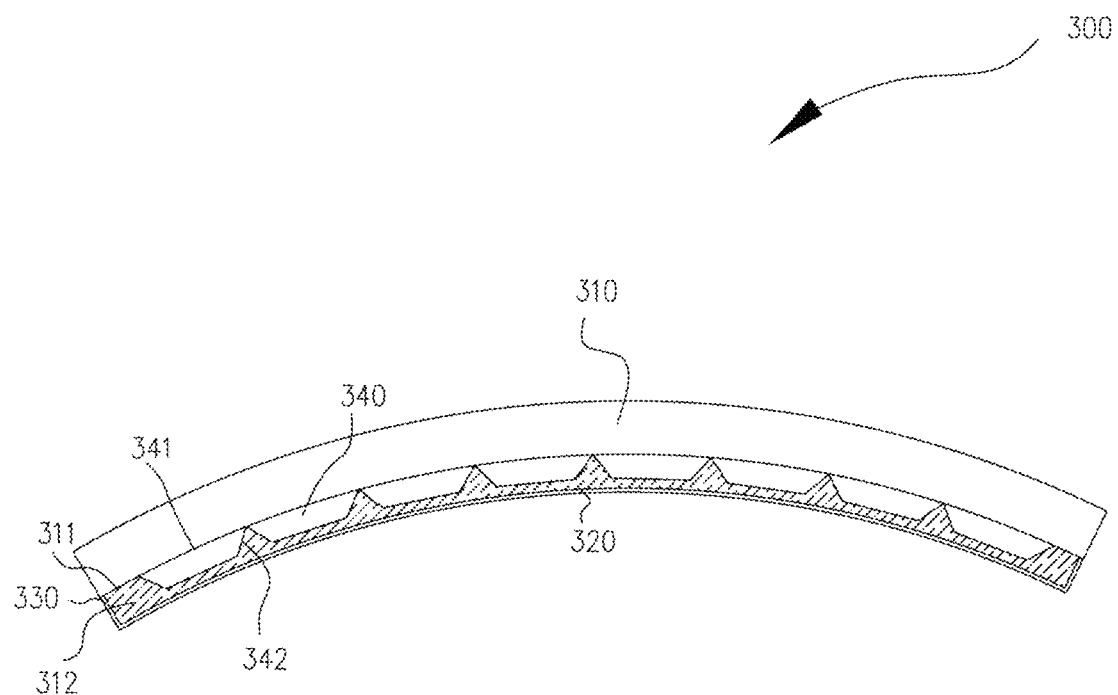
FIG. 8 illustrates a bent state of the flexible display screen module of FIG. 7.

As illustrated in FIGS. 7 and 8, the present disclosure further provides another flexible display screen module 300. The flexible display screen module includes: a flexible display screen 310; a flexible board 320 arranged opposite to the flexible display screen 310, in which a gap 311 is defined between the flexible board 320 and the flexible display screen 310 and filled with an electro-rheological fluid 312; a side board 330 coupling outer peripheries of the flexible display screen 310 and the flexible board 320 and sealing the gap 311; a plurality of electromagnets 340 secured to the flexible display screen 310 and located in the gap 311, in which each electromagnet 340 has a support surface 341 attached to the flexible display screen 310 and a side surface 342 at an acute angle to the support surface 341, and side surfaces 342 of adjacent electromagnets 340 are attached to each other by a magnetic force to cause the flexible board 320 to roll up.

In this embodiment, the flexible display screen module 300 is substantially identical to the flexible display screen module 200, and the difference is that on the basis of the flexible display screen module 200, the first flexible board 10 is removed, and the electromagnet 340 is directly attached to the flexible display screen 310. Thus, the overall thickness of the flexible display screen module 300 is reduced. Moreover, the electro-rheological fluid 312 is sealed by the flexible display screen 310, the flexible board 320, and the side board 330 together, so that the overall structure of the flexible display screen module 300 is simple.

Figure 9:
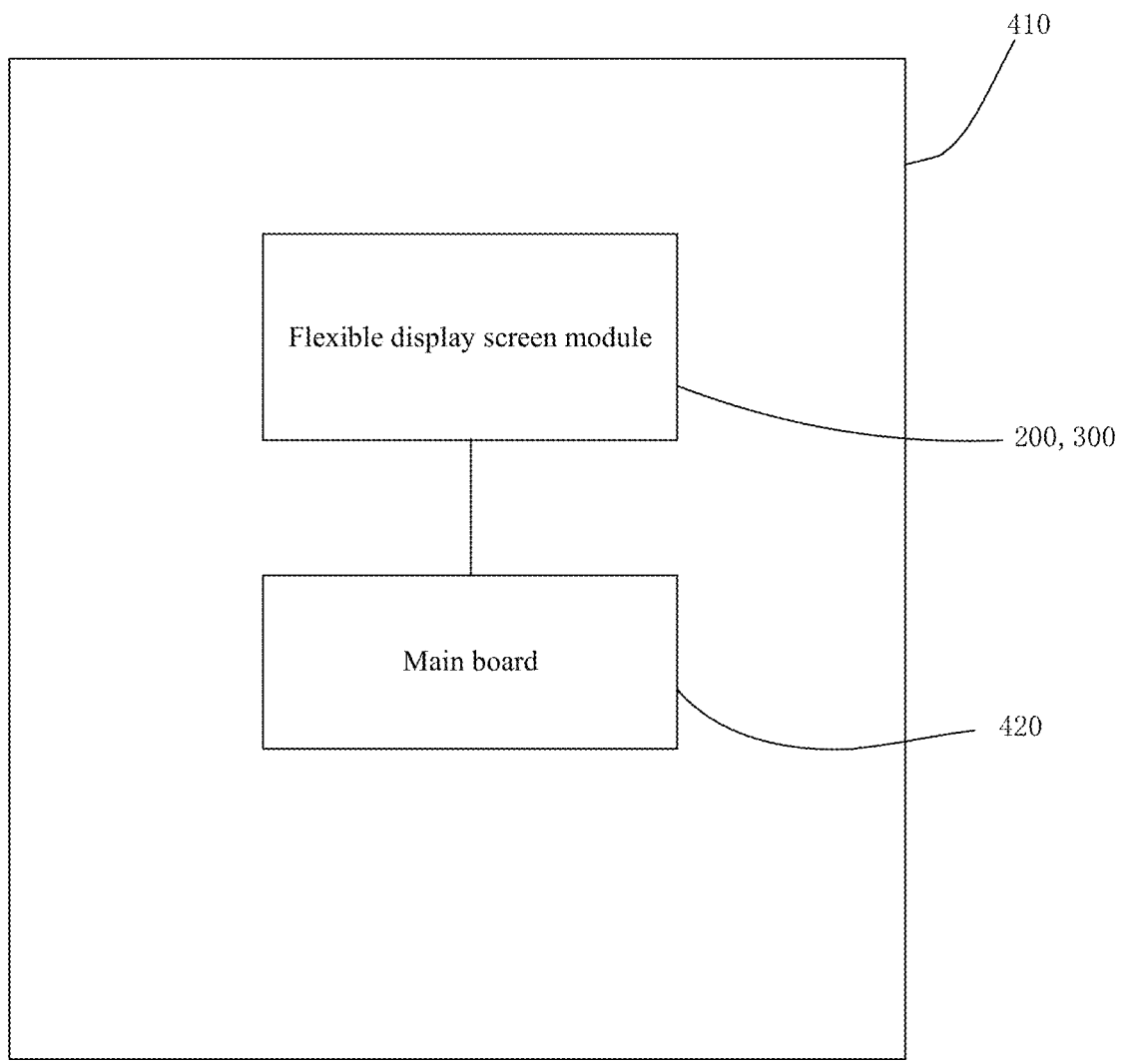
FIG. 9 illustrates a schematic view of a mobile terminal according to the present disclosure.

As illustrated in FIG. 9, the present disclosure further provides a mobile terminal 400. The mobile terminal 400 includes the flexible display screen module 200 or 300. The mobile terminal 400 also includes a housing 410, and a main board 420 secured in the housing 410. The flexible display screen module 200 or 300 is secured to the housing 410 and electrically coupled with the main board 420. The mobile terminal 400 can be a mobile phone, a tablet computer, a notebook computer or the like.

For the support structure, the flexible display screen module, and the mobile terminal according to the present disclosure, by providing the electro-rheological fluid between the first flexible board and the second flexible board, and densely providing the plurality of electromagnets to the first flexible board, when the first flexible board and the second flexible board are expanded, a voltage is applied to the electro-rheological fluid to make the electro-rheological fluid become solid, such that the electro-rheological fluid and the electromagnets together support the first flexible board, and hence the first flexible board exhibits a characteristic of a hard board, so as to support the flexible display screen. When the first flexible board and the second flexible board are rolled up, the voltage is revoked from the electro-rheological fluid to make the electro-rheological fluid become liquid, and the plurality of electromagnets are energized to make the electromagnets magnetic. Due to the trapezoidal shape of the electromagnet, after the first flexible board is rolled up, the side surfaces of the two adjacent electromagnets approach to each other and are attached to each other under magnetic attraction, and hence the first flexible board and the second flexible board are tightly rolled up together, such that the flexible display screen is conveniently driven to roll up. The support structure can support the flexible display screen when the flexible display screen is expanded, and facilitate the tight rolling and collapse of the flexible display screen when the flexible display screen is rolled up, thereby improving the user experience.

The above are some embodiments of the present disclosure. It should be noted that those skilled in the art can make improvements and modifications without departing from the principles of the present disclosure, and these improvements and modifications are also within the protection scope of the present disclosure.

What is claimed is:

1. A flexible screen support structure, comprising:
a first flexible board configured to be attached to a flexible display screen;
a second flexible board arranged opposite to the first flexible board, the second flexible board and the first flexible board defining a gap therebetween, and the gap being filled with an electro-rheological fluid;
a side board coupling outer peripheries of the first flexible board and the second flexible board and sealing the gap; and
a plurality of electromagnets secured to the first flexible board and located in the gap, each electromagnet having a support surface attached to the first flexible board and a side surface at an acute angle to the support surface, and side surfaces of adjacent electromagnets being able to attached to each other by a magnetic force to cause the first flexible board to roll up.

2. The flexible screen support structure according to claim 1, wherein the electromagnet is tapered.

3. The flexible screen support structure according to claim 2, wherein each electromagnet further has a bottom surface parallel to the support surface, and the bottom surface is at an obtuse angle to the side surface.

4. The flexible screen support structure according to claim 3, wherein the bottom surface is attached to the second flexible board.

5. The flexible screen support structure according to claim 4, wherein the side board is a flexible board.

6. The flexible screen support structure according to claim 1, wherein the first flexible board is an elastic memory board.

7. The flexible screen support structure according to claim 1, wherein the support surface is provided with a protrusion, and the first flexible board is provided with a groove corresponding to and fitted with the protrusion.

8. A flexible display screen module, comprising a flexible screen support structure and a flexible display screen, the flexible screen support structure comprising:
a first flexible board configured to be attached to the flexible display screen,
a second flexible board arranged opposite to the first flexible board, the second flexible board and the first flexible board defining a gap therebetween, and the gap being filled with an electro-rheological fluid,
a side board coupling outer peripheries of the first flexible board and the second flexible board and sealing the gap, and
a plurality of electromagnets secured to the first flexible board and located in the gap, each electromagnet having a support surface attached to the first flexible board and a side surface at an acute angle to the support surface, and side surfaces of adjacent electromagnets being able to attached to each other by a magnetic force to cause the first flexible board to roll up;
and the flexible display screen being attached to a side of the first flexible board facing away from the second flexible board.

9. The flexible display screen module according to claim 8, wherein the electromagnet is tapered.

10. The flexible display screen module according to claim 9, wherein each electromagnet further has a bottom surface parallel to the support surface, and the bottom surface is at an obtuse angle to the side surface.

11. The flexible display screen module according to claim 10, wherein the bottom surface is attached to the second flexible board.

12. The flexible display screen module according to claim 11, wherein the side board is a flexible board.

13. The flexible display screen module according to claim 8, wherein the first flexible board is an elastic memory board.

14. The flexible display screen module according to claim 8, wherein the support surface is provided with a protrusion, and the first flexible board is provided with a groove corresponding to and fitted with the protrusion.

15. A flexible display screen module, comprising:
a flexible display screen;
a flexible board arranged opposite to the flexible display screen, the flexible board and the flexible display screen defining a gap therebetween, and the gap being filled with an electro-rheological fluid;
a side board coupling outer peripheries of the flexible display screen and the flexible board and sealing the gap; and
a plurality of electromagnets secured to the flexible display screen and located in the gap, each electromagnet having a support surface attached to the flexible board and a side surface at an acute angle to the support surface, and side surfaces of adjacent electromagnets being able to attached to each other by a magnetic force to cause the flexible board to roll up.

* * * * *